(12) United States Patent
Tiemeijer et al.

(10) Patent No.: US 8,692,196 B2
(45) Date of Patent: Apr. 8, 2014

(54) METHOD OF USE FOR A MULTIPOLE DETECTOR FOR A TRANSMISSION ELECTRON MICROSCOPE

(75) Inventors: Peter Christiaan Tiemeijer, Eindhoven (NL); Uwe Luecken, Eindhoven (NL); Alan Frank de Jong, Eindhoven (NL); Hendrik Nicolaas Slingerland, Venlo (NL)

(73) Assignee: FEI Company, Hillsboro, OR (US)

( * ) Notice: Subject to any disclaimer, the term of this patent is extended or adjusted under 35 U.S.C. 154(b) by 732 days.

(21) Appl. No.: 12/564,617

(22) Filed: Sep. 22, 2009

(65) Prior Publication Data
US 2010/0072366 A1  Mar. 25, 2010

(30) Foreign Application Priority Data
Sep. 22, 2008  (EP) .................... 08164799

(51) Int. Cl.
*G01N 23/00* (2006.01)
(52) U.S. Cl.
USPC .......................... 250/311; 250/306
(58) Field of Classification Search
USPC ...... 250/307, 308, 311, 396 R, 397, 398, 392
See application file for complete search history.

(56) References Cited

U.S. PATENT DOCUMENTS

| | | | |
|---|---|---|---|
| 2,919,381 A | 12/1959 | Glaser | |
| 3,979,590 A | 9/1976 | Andersen | |
| 4,303,864 A | 12/1981 | Crewe et al. | |
| 4,362,945 A | 12/1982 | Riecke | |
| 4,389,571 A | 6/1983 | Crewe | |
| 4,414,474 A | 11/1983 | Crewe | |
| 4,684,808 A | 8/1987 | Plies et al. | |
| 4,853,545 A | 8/1989 | Rose | |
| 4,859,857 A | 8/1989 | Stengl et al. | |
| 4,962,313 A | 10/1990 | Rose | |
| 5,084,622 A | 1/1992 | Rose | |
| 5,221,844 A | 6/1993 | van der Mast et al. | |

(Continued)

FOREIGN PATENT DOCUMENTS

| | | |
|---|---|---|
| DE | 4204512 | 8/1993 |
| GB | 1364930 | 8/1974 |
| JP | 1264149 | 10/1989 |
| WO | WO03032351 | 4/2003 |

OTHER PUBLICATIONS

Reimer, Ludwig, "Transmission Electron Microscopy," 1984, p. 37.

(Continued)

*Primary Examiner* — Phillip A Johnson
*Assistant Examiner* — Brooke Purinton
(74) *Attorney, Agent, or Firm* — Scheinberg & Assoc., PC; Ki O; Michael O. Scheinberg

(57) ABSTRACT

The invention relates to a method for correcting distortions introduced by the projection system (106) of a TEM. As known to the person skilled in the art distortions may limit the resolution of a TEM, especially when making a 3D reconstruction of a feature using tomography. Also when using strain analysis in a TEM the distortions may limit the detection of strain.

To this end the invention discloses a detector equipped with multipoles (152), the multipoles warping the image of the TEM in such a way that distortions introduced by the projection system are counteracted. The detector may further include a CCD or a fluorescent screen (151) for detecting the electrons.

11 Claims, 5 Drawing Sheets

Reference grid    Barrel distortion    Pincushion distortion

(56) References Cited

U.S. PATENT DOCUMENTS

| | | |
|---|---|---|
| 5,336,891 A | 8/1994 | Crewe |
| 5,481,164 A * | 1/1996 | Langner et al. ............... 315/370 |
| 5,798,524 A | 8/1998 | Kundmann et al. |
| 5,838,011 A | 11/1998 | Krijn et al. |
| 5,965,894 A | 10/1999 | Krijn et al. |
| 5,986,269 A | 11/1999 | Krijn et al. |
| 6,184,975 B1 | 2/2001 | Henstra et al. |
| 6,191,423 B1 | 2/2001 | Krijn et al. |
| 6,246,058 B1 | 6/2001 | Tiemeijer |
| 6,329,659 B1 | 12/2001 | Krijn et al. |
| 6,455,848 B1 | 9/2002 | Krijn et al. |
| 6,723,997 B2 | 4/2004 | Matsuya et al. |
| 6,737,647 B2 | 5/2004 | Schonhense et al. |
| 6,770,887 B2 | 8/2004 | Krivanek et al. |
| 6,852,983 B2 | 2/2005 | Matsuya et al. |
| 6,858,844 B2 | 2/2005 | Zach |
| 6,888,145 B2 | 5/2005 | Muller et al. |
| 6,924,488 B2 | 8/2005 | Matsuya et al. |
| 6,995,378 B2 * | 2/2006 | Uhlemann et al. ........ 250/396 R |
| 7,012,262 B2 | 3/2006 | Rose |
| 7,271,396 B2 | 9/2007 | Shemesh |
| 7,276,690 B1 * | 10/2007 | Lorusso et al. ............... 250/307 |
| 7,378,667 B2 | 5/2008 | Henstra |
| 7,518,121 B2 | 4/2009 | Maas et al. |
| 2003/0116721 A1 * | 6/2003 | Ito .............................. 250/492.2 |
| 2007/0069151 A1 * | 3/2007 | Stovall et al. ................. 250/397 |

OTHER PUBLICATIONS

Hue, F., et al., "Calibration of Projector Lens Distortions for Quantitative High-Resolution TEM," Microsc Microanal, 2005, pp. 552-553, vol. 11, Suppl. 2.

Haider, M., et al, "Upper Limits for the Residual Aberrations of a High-Resolution Aberration-Corrected STEM," Ultramicroscopy, 2000, pp. 163-175, vol. 81.

"Aberration Correction in Electron Microscopy," Materials, Science Division, Argonne National Laboratory, Jul. 18-20, 2000, 16 p.

* cited by examiner

METHOD OF USE FOR A MULTIPOLE DETECTOR FOR A TRANSMISSION ELECTRON MICROSCOPE

TECHNICAL FIELD

The invention relates to a method for correcting distortions in a particle-optical apparatus, the particle-optical apparatus comprising:
- a particle source for producing a beam of particles,
- an object plane on which an object to be imaged may be placed,
- a condenser system for illuminating the object with the beam of particles,
- a projection system for forming an enlarged image of the object by imaging particles transmitted through the object on an image plane, the projection system introducing distortions, and
- a detector for detecting the enlarged image, the method comprising:
- forming an image in which the distortions are at least partially corrected.

The invention further relates to a method of determining the distortions.

BACKGROUND

This method is disclosed in "Calibration of projector lens distortions for quantitative high-resolution TEM", F. Hue et al., Microsc. Microanal. 11 (supplement 2), 2005, pages 552-553, (DOI:10.1017/S143192760551081X), and is used to correct the distortions introduced by the projection system of a Transmission Electron Microscope (TEM).

In a TEM an object, also referred to as a sample, is irradiated with a beam of electrons, the electrons having an energy of e.g. between 50 keV and 400 keV. Some of the electrons are transmitted through the sample, and these electrons are focused on the image plane to form an enlarged image of the sample. The imaging of the sample on the image plane is realized with a projection system, that can be set to a configurable magnification of e.g. between $10^3$ and $10^6$ times. Typically a detector, such as a fluorescent screen or a CCD camera, is placed in the image plane, whereby the image is detected.

As known to the person skilled in the art a projection system not only forms an image of the sample to the image plane, but also introduces aberrations and distortions. In this context aberrations are the errors resulting in a point to be imaged as a blur, and distortions are those errors that result in a warp of the image.

Distortions of the image may limit the performance of e.g. a TEM. Two examples where distortions are likely to limit the performance of a TEM are tomography and strain analysis.

For the construction of a 3D representation of a sample by tomography a large number of images, typically between 50 and 100 images, are made. Each image is acquired at a slightly different orientation (tilt) of the sample. By combining these images a 3D reconstruction can be formed. When the images are warped, due to distortions, the location of a feature in the sample with respect to a reference point in the sample is mis-represented. As in some images the feature may be in the centre of the image, while in other images the feature may be removed from the centre, the displacement is not constant, resulting in a blurring of the feature in the 3D reconstruction. This is aggravated by the fact that the magnification used in tomography is often relatively low, resulting in relative large distortions due to the large beam diameters in the particle-optical lenses and other particle-optical elements. Therefore in tomography distortion may limit the resolution in the 3D representation.

In strain analysis the warp of the lattice in a crystallographic sample is determined. This warp may be the result of strain, and therefore determining the warp is a manner to determine the strain in the crystal. Obviously, if the image already shows warp for an unstrained crystal, this results in errors in the strain determined when imaging strained crystals.

The aforementioned publication discloses that a sample in the form of a perfect crystal of silicon is inserted in a TEM. The location dependent displacements of the image of this perfect object are measured. It is found that the magnification over the field of view may vary as much as 5%, and that local rotation may be 2 degrees. The publication proposes to map the local displacements in a displacement field and therewith correct experimental images by displacing the pixels in the image, thus forming a modified image in which the distortion is at least partially corrected. It is found that in this way the local magnification error was reduced from its original 5% to 0.1% and the local rotation error was reduced from its initial 2 degrees to 0.1 degrees.

The publication further mentions that the projector lens distortions are quite stable over a time period of at least four years.

A disadvantage of the aforementioned method is that it demands that every image is processed to eliminate the distortions. Especially when processing a large number of images, such as used in tomography, this may limit throughput. A further disadvantage is that the displacement of the pixels in the image may result in artefacts.

BRIEF SUMMARY OF THE INVENTION

The invention intends to provide a method to correct for distortions without the need to process each image.

For this purpose the method according to the invention is characterized in that the detector comprises multipoles, and the multipoles are excited in such a way that the distortions in the enlarged image are at least partially corrected.

The invention is based on the insight that multipoles warp an image. By introducing multipoles in the detector, and exciting the multipoles in such a way that the warped image is de-warped, the effect of the distortions in the detected image is corrected, thereby eliminating the need to correct each image obtained.

It is noted that, as known to the person skilled in the art of particle optics, multipoles include dipoles, quadrupoles, hexapoles, octupoles, etc. It is also noted that a multipole can be a magnetic multipole, an electrostatic multipole, or a combination thereof. It is also possible to physically combine e.g. a magnetic quadrupole with an electrostatic octupole, or to mimic a multipole of order N with a multipole of a higher order.

It is mentioned that U.S. Pat. No. 4,853,545 discloses an apparatus in which a line-shaped object is irradiated with a beam of electrons, said object is imaged on a surface (typically the surface of a semiconductor wafer that is covered with a photoresist) with a projection lens forming a demagnified image. To correct the distortions of the projection lens two multipoles, preferably octupoles, are introduced between the object and the projection lens.

Said apparatus differs from the invention in that the object is line-shaped, that the image is a demagnified image and that the multipoles correcting the image are placed between the object and the projection lens. It is not disclosed whether the system can image objects with another form than a line-shaped object without distortions, i.e. whether the multipoles are able to correct distortions in a plane instead of along a line. It is also not disclosed how the correct excitation of the multipoles is determined.

It is further mentioned that U.S. Pat. No. 5,798,524 discloses a TEM with a post-column energy filter (PCEF). The PCEF forms an energy filtered image. To that end an image, projected on the entrance plane of the PCEF, is imaged on a CCD camera, and between the CCD camera and the entrance of the PCEF an energy dispersive element (in the form of a sector magnet) and an energy selective element (in the form of a slit) are placed. Only electrons with a predetermined energy (depending on the excitation of the sector magnet and the position and width of the slit) are imaged on the CCD. The PCEF comprises multipoles to image the entrance plane onto the CCD. The correct excitation of the multipoles is determined by placing a diaphragm with an array of apertures at the entrance plane, and adjusting the multipoles, such that an undistorted image of the array of apertures is formed. The multipoles are thus adjusted to form a 'true' image of the entrance plane, and distortions in the image formed at the entrance plane, introduced by the projection system, are not corrected.

In a preferred embodiment of the method according to the invention, prior to forming the enlarged image of the object, the distortions of the projection system are determined by generating a pattern with known geometry, forming an enlarged image of said pattern and measuring the distortions introduced, and the multipoles are excited to at least partially correct the distortions.

In this embodiment a pattern with known geometry is generated and imaged, and the distortions in the image are measured. The multipoles are then excited to correct the distortions. Obviously this part of the method may be executed repeatedly so as to iterate to the optimum setting of the multipoles.

Forming the pattern may interfere with normal imaging of the object. When the multipoles are set to the correct excitation, the apparatus can be brought in a state in which normal imaging is possible, and the object can be imaged without distortions or with at least reduced distortions.

It is noted that, although lenses may form an image of the pattern in intermediate image planes, and the pattern is thus formed in each of these intermediate image planes, in this context the phrase 'generated' is used for the action to define the pattern at the first plane where the pattern is formed, that is: the plane where the pattern is formed furthest removed from the image plane where the pattern is imaged.

It is further noted that said first plane is also the only plane where the pattern is undistorted, as all images of this plane are distorted by the lenses and particle-optical elements imaging said first plane.

In a further embodiment of the method according to the invention the pattern is generated by irradiating a diaphragm with a known pattern of transparent areas with a beam of particles.

In this embodiment a number of beams are formed by irradiating a diaphragm with the beam of particles, said diaphragm showing transparent areas in a known geometry. The known geometry may be an pattern of apertures, such as an array of round apertures, but also other known geometries may be used, e.g. geometries in which the apertures are formed as e.g. crosses, and/or where the apertures are not arranged in a square array.

It is noted that the transparent areas in the diaphragm may be apertures, totally transparent to the particles, but may also be thinned parts in the diaphragm, the diaphragm blocking the particles and the thinned parts partially transparent to the particles. Such a diaphragm with thinned parts instead of with open apertures makes it possible to form a pattern in which non-transparent parts are completely surrounded by transparent parts. The diaphragm may be formed from (a part of) a semiconductor wafer, and the thinned parts may be e.g. a silicon nitride or silicon oxide layer of the wafer. The non-transparent parts may include e.g. heavy metal deposits on the diaphragm, the deposits blocking the transmission of the particles.

In another embodiment of the method according to the invention the pattern is generated by scanning the particle beam in a known scan pattern.

A known geometry may be formed by scanning the beam in a known pattern. Preferably the beam is a focused beam. The scanning is performed by deflecting the beam at a plane between the particle source and the plane where the pattern is formed.

In yet another embodiment of the method according to the invention the projection system forms at least one intermediate image of the object plane in an intermediate image plane, the magnification from the object plane to the intermediate image plane being less than the magnification form the object plane to the image plane, and the pattern is generated at the intermediate image plane.

By generating the pattern in an intermediate plane, the pattern is magnified less than when generated in the object plane of the apparatus. For e.g. a TEM the magnification between object plane and image plane may be $10^6$ times. As the image size is limited to, for example, several centimeters, the imaged part of the pattern would then have a size of less than several tens of nanometers. Thereby the diameter of the apertures in a diaphragm must be less than 1 or 2 nm. To relieve these demands, the diaphragm can e.g. be placed in the intermediate image plane closest to the object plane, in which already a magnification of e.g. 50× with respect to the object plane is achieved. This implies that a diaphragm with apertures with e.g. 50 nm diameter and 500 nm pitch may be used. Such a diaphragm can be formed with e.g. ion beam milling of a silicon substrate.

It is noted that, although in this embodiment the distortions of the lens(es) between object plane and pattern plane cannot be corrected, the lenses closer to the image plane typically introduce more distortions than the lens closer to the object. This is caused by the progressively larger magnification from the object to the intermediate image planes, and the larger beam diameter resulting from this. Therefore correction of the distortions of the lenses in the part of the projection system between the first intermediate image plane and the image plane typically results in negligible distortions of the complete projection system.

It is mentioned that, due to the different magnifications that can be configured in such an apparatus, it may be preferred to form a pattern in which features with different sizes are present.

It is further noted that in this context the magnification is the absolute magnification, and the sign of the magnification is ignored, that is: a magnification of −20× represents a larger magnification that a magnification of −10× or a magnification of 10×.

In yet another embodiment of the method according to the invention the method further comprises:
  determining the distortions for different settings of the apparatus, the different settings comprising different magnifications of the projection system and/or different energies of the particles illuminating the object position, forming a set of data for the different settings,
after which the projection system is set for the magnification and energy used to image the object, and, using said set of data, the multipoles are excited to correct at least partially the distortions.

In this embodiment data is collected for the distortions at different settings of the projection system. By using this data the excitation of the multipoles for a setting of the projection system, said setting used to image the object, is then determined.

In a further embodiment of the method according to the invention the set of data represents information concerning the excitation of the multipoles needed to correct distortions at different settings of the projection system.

In this embodiment the set of data represents the excitation of the multipoles needed to correct the distortions at different settings of the projection system. The data thus typically represents values to set a number of currents (in the case of a magnetic multipole) or a set of voltages (in the case of an electrostatic multipole).

In another embodiment of the method according to the invention the set of data represents parameters describing the distortions at different settings of the projection system.

As known to the person skilled in the art distortions can be described by parameters. By storing values corresponding to the parameters describing the distortions, the values can be used to describe the distortion occurring for a setting of the projection system used to image the object. With the thus reconstructed distortion the excitation of the multipoles can be determined.

In a still further embodiment of the method according to the invention the excitation of the multipoles is determined by interpolating or curve fitting the sets of data.

The set of data (table of values) need not cover every setting to be used: interpolation and/or curve fitting may be used to reduce the amount of data.

BRIEF DESCRIPTION OF THE SEVERAL VIEWS OF THE DRAWING

The invention is now described with reference to figures, in which the identical reference numerals denote corresponding elements. The accompanying drawings are not intended to be drawn to scale. For purposes of clarity, not every component may be labeled in every drawing. Here.

DETAILED DESCRIPTION OF THE PREFERRED EMBODIMENTS

Figure 1:
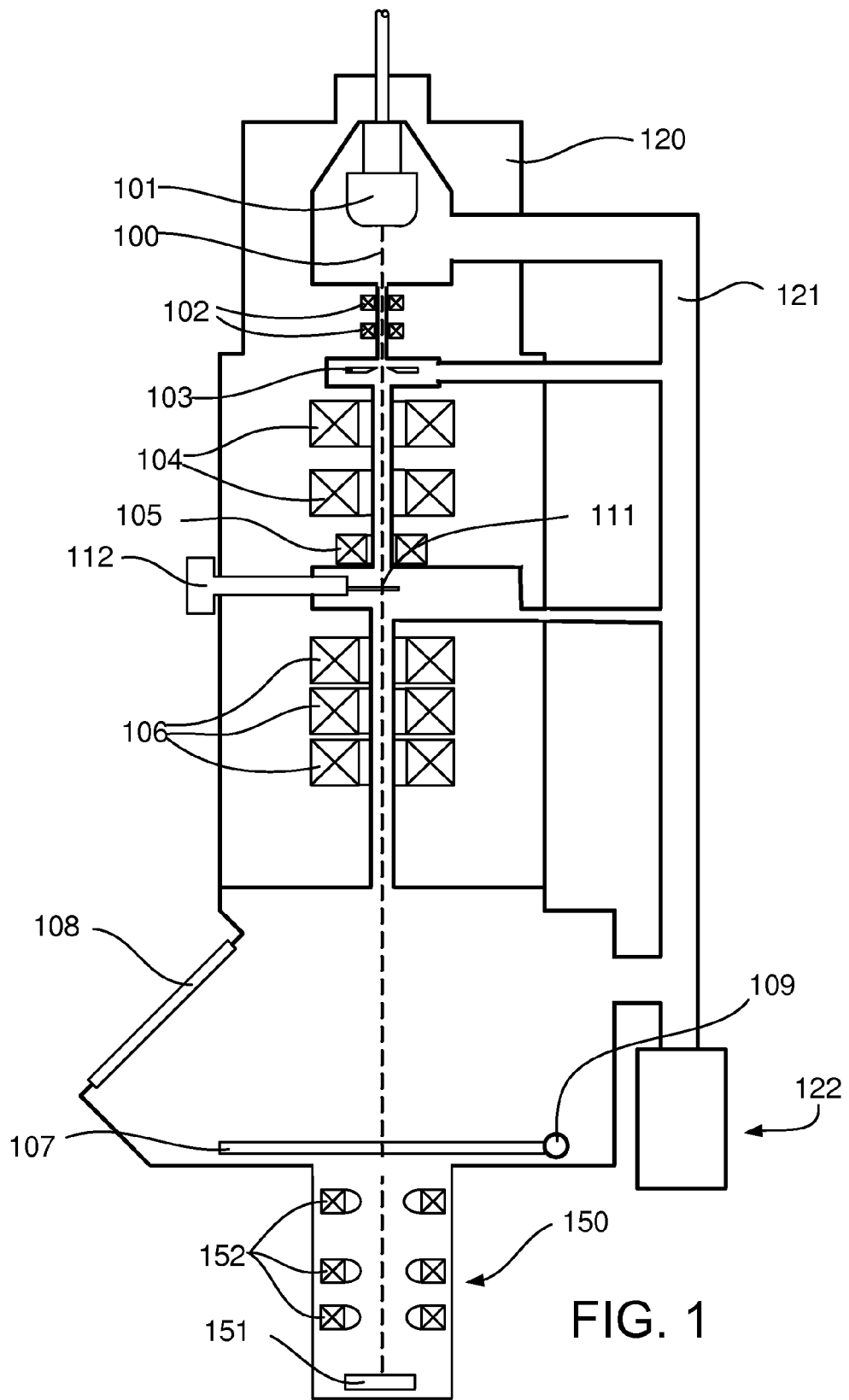
FIG. 1 schematically shows the apparatus according to the invention.

FIG. 1 schematically shows the apparatus according to the invention. It shows a TEM, comprising a vacuum housing 120 evacuated via tube 121 by a vacuum pump 122. A particle source in the form of an electron gun 101 produces a beam of electrons along a particle-optical axis 100. Deflectors 102 centre the beam of particles on beam limiting aperture 103. The beam then passes through a condenser system comprising two lenses 104.

A sample 111 is held by a manipulator 112, positioning the sample in the object plane of the objective lens 105. The sample is imaged by a projection system comprising lenses 106 onto fluorescent screen 107, and can be viewed through a window 108. The fluorescent screen 107 is connected to a hinge 109 and can be retracted/folded away, so that the image made by the projection system is imaged on detector 150. It is noted that the projection system may need to be re-focused so as to form the image on the detector 150 instead of on the fluorescent screen. It is further noted that the projection system forms intermediate images, e.g. at plane 110. The detector comprises a charge coupled device (CCD) 151 for detecting impinging electrons. Multipoles 152 correct the distortions introduced by the projection system.

In the evacuated housing 120 of the TEM an electron source 101 produces a beam of energetic electrons. The electron source can be e.g. a field emitter gun, a Schottky emitter, or a thermionic electron emitter. The electrons are then accelerated to an adjustable energy of typically between 80-300 keV, although TEM's using electrons with an adjustable energy of e.g. 50-500 keV are known. The electron beam then passes through a beam limiting aperture in a platinum diaphragm 103. To align the electron beam properly to the aperture the beam can be shifted and tilted with the aid of deflectors 102, so that the central part of the beam passes through the aperture along particle-optical axis 100. Focusing of the beam is achieved with magnetic lenses 104 of the condenser system together with (part of the) objective lens 105. Objective lens 105 often immerses the object in its magnetic field. The beam irradiating the sample may be a focused beam scanned over the sample, or it may be a parallel beam. Often deflectors (not shown) are used to centre the beam on a region of interest, or to scan the beam over the surface of the sample. Where the beam impinges on the sample, secondary radiation is generated in the form of secondary electrons, light, X-ray's etc. This radiation may be detected by detectors (not shown). A part of the beam is transmitted through the sample, and is then imaged by the lenses 106 of the projection system on a fluorescent screen 107. The enlarged image formed on the screen typically has a magnification of between $10^3$ to $10^6$ times and may show details as small as 0.1 nm or smaller. The enlarged image can then be viewed via the window 108. The fluorescent screen is connected to the housing with a hinge, enabling the screen to be folded away so that the image can be detected by detector 150. Detector 150 is shown here as comprising a CCD chip for detecting electrons, but it is also well known to use a CCD that detects light, the light formed by e.g. a YAG crystal that is e.g. bonded to the CCD by optical fibres. In such an indirect detector the YAG crystal emits a number of photons when an electron hits the crystal, and part of these photons is detected by the CCD camera. In direct detectors CCD's the electrons impinge on the semiconductor chip of the CCD and generate electron/hole pairs, thereby forming the charge to be detected by the CCD chip.

The image formed on the fluorescent screen and on the CCD camera is distorted by the distortion of the lenses 106. To correct these distortions multipoles 152 are used, each of which may be a magnetic multipole, an electrostatic multipole or a combination thereof. It is noted that here three levels/sets of multipoles are shown, but a smaller number may suffice. In other cases a larger number of multipoles may be necessary to correct the distortions with sufficient accuracy.

For adjusting the multipoles an object with a known shape is imaged on the image plane. The object is e.g. a diaphragm with an array of apertures in a known pattern. The size of the pattern depends on the magnification of the projection system: when a high magnification is selected, only a small field-of-view (FoV) is imaged on the detector, and within this FoV a pattern with sufficient resolution must be present to be imaged. Assuming a CCD with e.g. 5 k×5 k pixels, and an image resolution of 0.1 nm, the FoV may be as small as 500×500 nm². However, at a low magnification a FoV as large as 500×500 µm² may be imaged. Therefore patterns showing structures of a few nm should be used at highest magnification, and the structures with a dimension of a few µm at the lowest magnification.

It is noted that FIG. 1 shows a schematic description of a typical TEM only, and that in reality a TEM comprises many more deflectors, apertures etc. Also TEM's with correctors for correcting the aberration of the objective lens 105 are known, said correctors employing multipoles and round lenses. Also other detectors may be used, such as secondary electron detectors, X-ray detectors, etc. These detectors may be positioned at the side of the sample facing the gun or the side of the sample facing detector 150.

Figure 2A:
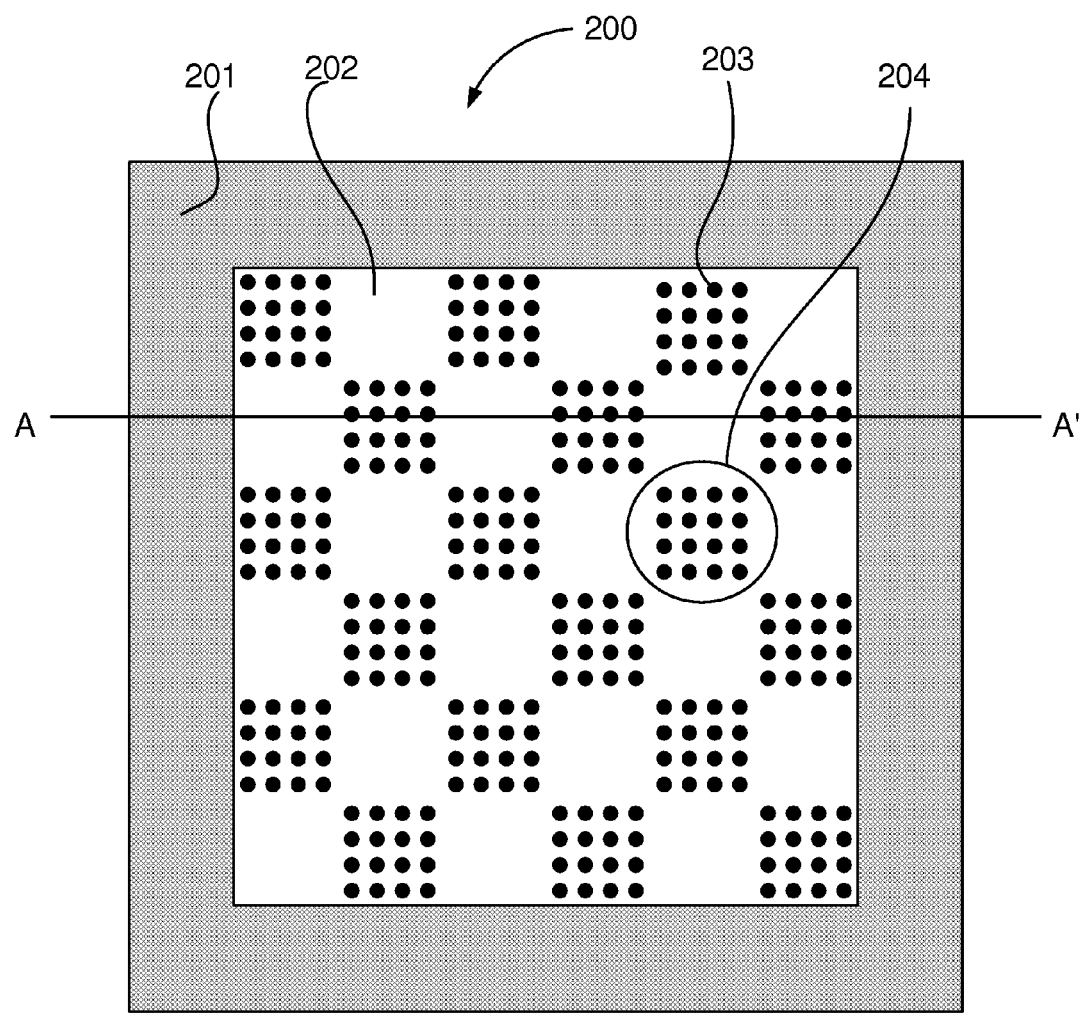
FIGS. 2A and 2B schematically show a diaphragm to be used for aligning the multipoles, FIG. 3 schematically shows examples of image distortion, FIG. 4 schematically shows a flow chart how to operate an apparatus according to the invention, and in FIG. 5 different steps for determining the correct excitations of the multipoles needed for the correction of the distortions are shown.
Figure 2B:
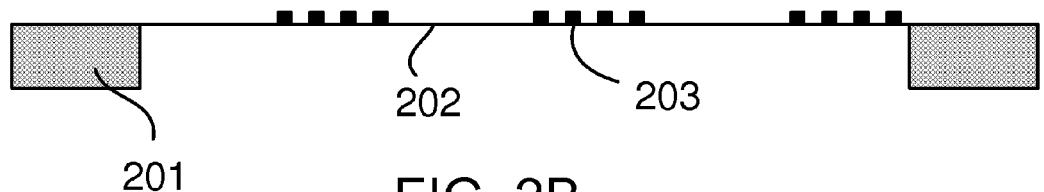

FIGS. 2A and 2B schematically show a diaphragm offering structures of a few nanometers and of a few micrometers simultaneously. FIG. 2A shows such a diaphragm as seen from the object position, FIG. 2B shows a cross section of FIG. 2A along line AA'.

FIG. 2A shows an aperture 200, such as a piece of e.g. a silicon wafer 201 with a semi-transparent membrane 202 of e.g. $Si_3N_4$ or $SiO_2$. On this membrane a number of structures 203 is deposited, e.g. heavy metal dots, such as tungsten, platinum or gold dots. The dots are deposited on the membrane by e.g. Ion Beam Induced Deposition (IBID) or Electron Beam Induced Deposition (EBID), techniques known per se, or they may be deposited with lithographic techniques. The dots are arranged in arrays 204, and said arrays are themselves arranged to form super arrays. Hereby a pattern with a large dynamic range is formed, ranging from the positional accuracy of the dots themselves to the point of gravity of the arrays within the super array. If necessary this method can be repeated to form an even larger structure in arranging the super arrays in a next higher order.

It is noted that, although the example shows a pattern of dots on the semi-transparent membrane only, also patterns comprising lines, squares, crosses, etc. on such a membrane may be used, or patterns with structures such as dots with different dimensions (diameters) may be used.

It is further noted that, instead of a pattern of structures supported by a semi-transparent membrane, also a (non-transparent) diaphragm with e.g. through-holes may be used. Through-holes with small diameters can be made by e.g. Focused Ion Beam (FIB) machining, or by lithographic techniques.

It is also noted that, by placing the diaphragm in an intermediate image plane, e.g. in plane 110 shown in FIG. 1, the magnification between the diaphragm and the enlarged image is less than the magnification of the projection system. At the highest magnification of the projection system the magnification between the object and the first intermediate image plane may be e.g. 50 times. As a consequence the minimum feature size of the diaphragm may then be e.g. 50 times larger, resulting in relaxed requirements for the minimum feature size and pitch.

Figure 3:
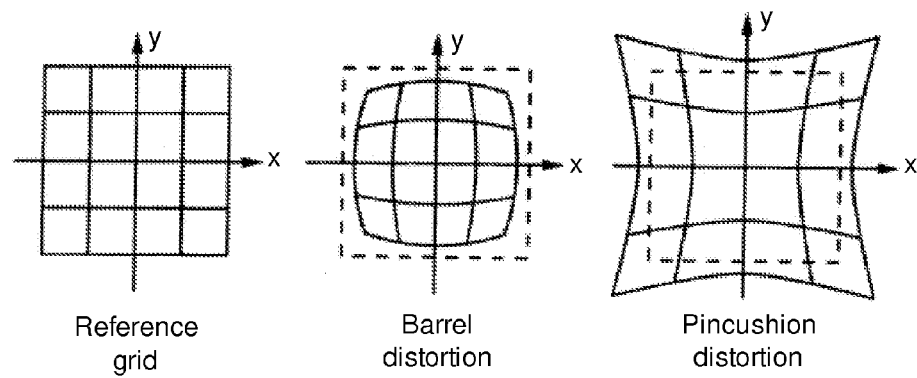

FIG. 3 schematically shows image distortion.

In FIG. 3 a reference grid, in the form of 5 horizontal and 5 vertical lines, is imaged by two systems, one system showing barrel distortion and one system showing pincushion distortion. Barrel- and pincushion distortion are the most well-known distortions.

Figure 4:
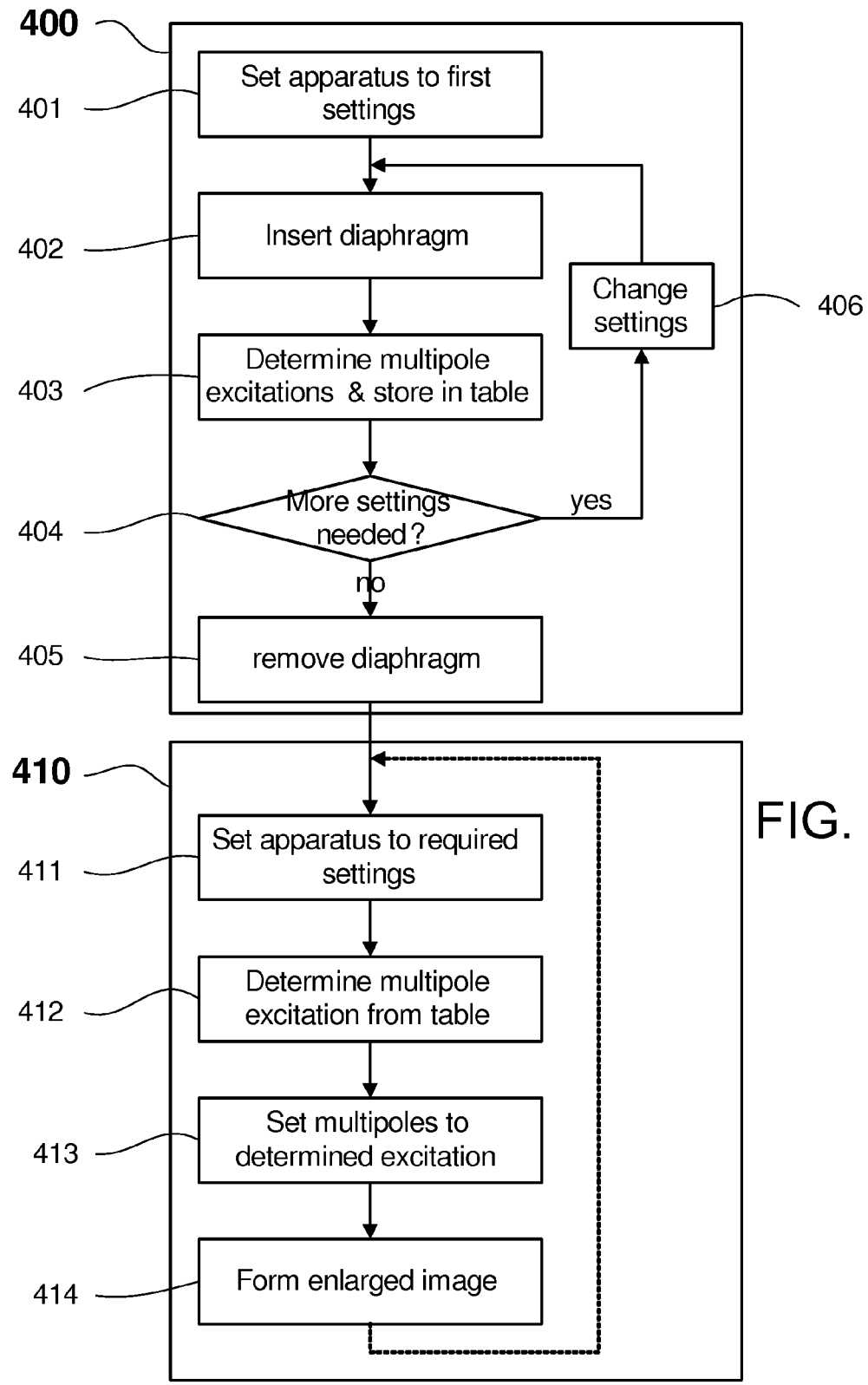

FIG. 4 schematically shows a flow chart how to operate an apparatus according to the invention.

In a first block of steps 400 settings for the multipoles are determined.

In step 401 the apparatus is set to a first set of settings, including magnification of the projection system and a setting of the acceleration voltage of the particle beam. It is noted that the distortions of the projector system not only vary with varying magnifications, but vary for different particle energies too. This is caused by the non-linear magnetization of the pole pieces of the magnetic lenses forming the projection system, as well as residual magnetism of some parts in the projector system.

In step 402 a diaphragm is inserted in the object plane or in an intermediate image plane, as described earlier.

In step 403 the excitation of the multipoles is determined for which the distortions in the image are corrected. This single step involves several sub-steps, to be explained in FIG. 5. Finally the found values are stored in a computer memory.

In step 404 it is determined whether more settings are needed. If more settings are needed, then the settings of the microscope are changed in step 406, e.g. changing the magnification or acceleration voltage.

If no more settings are needed, then the diaphragm is removed in step 405, after which the microscope is ready for normal use.

The second block of steps 410 shows the routine use of the instrument.

In step 411 the settings are set to the required settings for imaging of the object. This may involve setting of the magnification and/or setting of the acceleration voltage.

In step 412 it is determined, using the values stored in the computer memory in step 403, what settings for the multipoles should be used. This may involve interpolating between stored values.

In step 413 the multipoles are set accordingly.

In step 414 an enlarged image of the sample is made.

It is noted that, as observed in the earlier cited publication in "Calibration of projector lens distortions for quantitative high-resolution TEM", F. Hue et al., the distortions are quite stable in time. Therefore the steps in block 400 need not be performed often, but e.g. only when the column of the microscope is taken apart or during a major service overhaul. The steps in block 410 are routinely repeated, where sometimes the settings are changed, and sometime the settings are kept identical.

Figure 5:
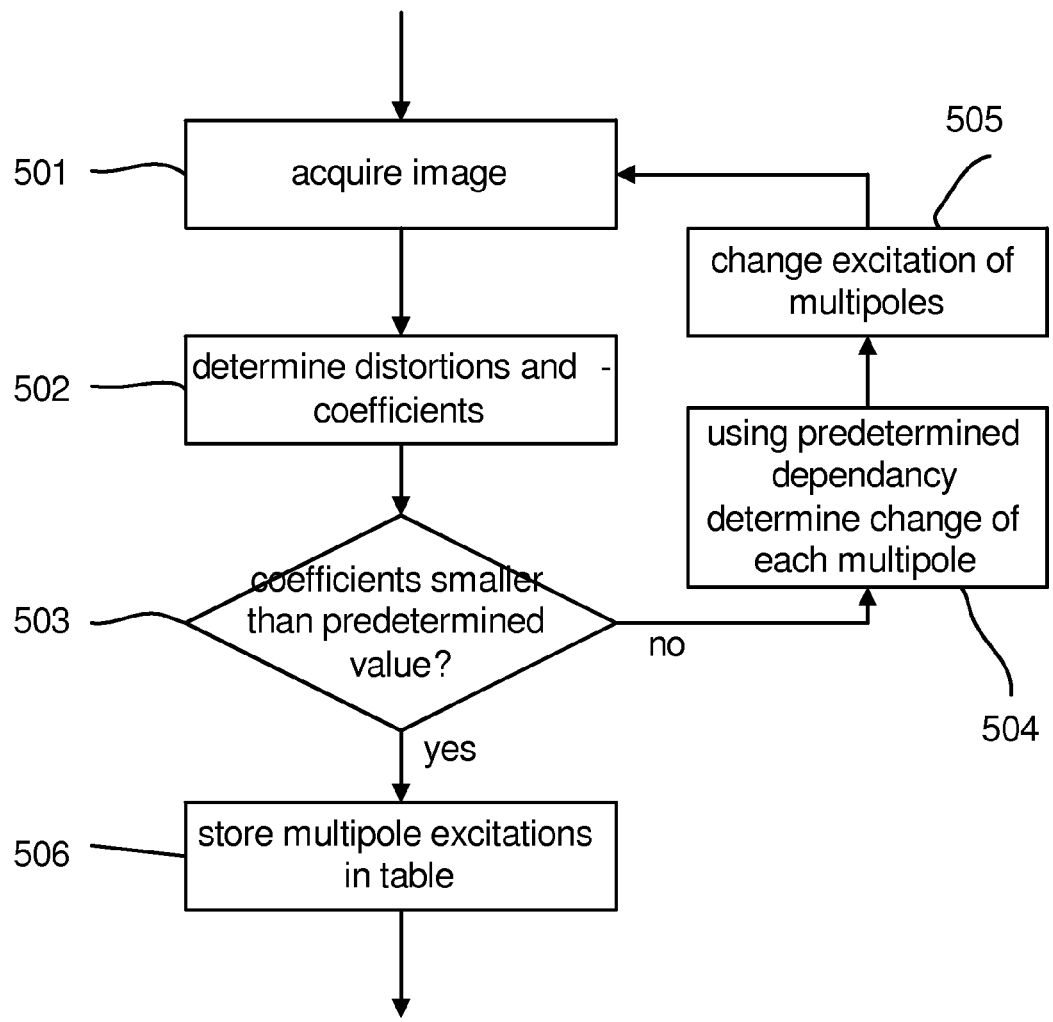

In FIG. 5 different steps for determining the correct excitations of the multipoles needed for the correction of the distortions are shown.

Distortions may be described as follows:

The position of each point of the object can be described by a complex value $$u = (x+iy) = r\, e^{i\phi}$$

and each corresponding point of the image is then represented by the complex value $$U = (X+iY) = A_{10}u + A_{01}\bar{u} + A_{20}u^2 + A_{11}u\bar{u} + A_{02}\bar{u}^2 + \ldots$$
$$= \Sigma A_{n,m} u^n \bar{u}^m$$

In this formula the coefficient $A_{10}$ describes the magnification and rotation of the image, and the coefficients of all other terms describe distortions. As an example, $A_{01}$ describes the distortion of a circle into an ellipse. Similarly, the real part of $A_{21}$ corresponds with barrel/pincushion distortion, while the imaginary part of $A_{21}$ describes the so-named anisotropic distortion.

As a pattern with known geometry is generated and imaged, for a number of object points $u_1, \ldots, u_N$ a number of image points $U_{1...N}$ is found. From the distance of the image points from their expected position the distortions in the image can be determined.

It is noted that the use of a projection system with multiple lenses each causing distortions, in which the distortion centres in general do not coincide, and each its own distortion coefficients, may result in complicated distortions in the image plane of the projection system.

In a way similar to the way in which the distortions in the image are described, for each multipole an effect on the image can be comparing an image in which all multipoles have an excitation equal to zero and an image in which a multipole has an excitation. It can thus be determined which set of excitations is needed to correct a distortion described by a distortion coefficient $A_{nm}$.

It is noted that not all distortions need to be corrected, as it is a convergent series, and the distortions of high order thus have very little effect.

Step 403 if FIG. 4 can thus be broken up as follows:

In step 501 an image of the known pattern is acquired.

In step 502 the distortion coefficients are determined. It is noted that the number of coefficients is in most cases already determined at an earlier stage, e.g. by the manufacturer of the microscope.

In step 503 it is determined whether the distortion is within limits by comparing the coefficients to predetermined values.

If the distortions are not small enough, then in step 504 the required multipole excitations for nulling each distortion coefficient are determined. This results in a summation of multipole settings due to the excitations needed for nulling each of the coefficients.

In step 505 these multipole excitation is added to the multipole excitation that was already present, resulting in a new corrected value of multipole excitations. After this the process is repeated, until the coefficients and/or the distortions are small enough.

Finally, in step 506, the multipole excitations needed for this setting of the apparatus is stored in a table.

It is noted that, when low order distortions in the image are large, it is often better to correct these distortions first and acquire a new image before correcting the higher order distortions.

Although the description of the present invention above is mainly directed at a method of correcting distortions in a sample image produced by a particle-optical apparatus, it should be recognized that an apparatus performing the operation of this method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate from, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle-optical apparatus in order to image a sample using a beam of particles. Such particles used to image a sample inherently interact with the sample resulting in some degree of physical transformation. Further, throughout the present specification, discussions utilizing terms such as "calculating", "determining", "measuring", "generating", "detecting", "forming", or the like, also refer to the action and processes of a computer system, or similar electronic device, that manipulates and transforms data represented as physical quantities within the computer system into other data similarly represented as physical quantities within the computer system or other information storage, transmission or display devices.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. Method for correcting distortions of a particle-optical apparatus, the particle-optical apparatus comprising:
   a particle source for producing a beam of particles, an object plane on which an object to be imaged is placed, and when illuminated, having an intermediate image plane where a pattern is generated, a condenser system for illuminating the object plane with the beam of particles, a projection system for forming an enlarged image of the object plane by imaging particles transmitted through the object on an image plane, the projection system introducing pincushion or barrel distortions, a detector for detecting the enlarged image, in which the detector comprises multipoles, the method comprising:

producing a beam of particles;

illuminating the object plane with the beam of particles;

generating a known pattern in the intermediate image plane;

forming an enlarged image on the image plane of the object plane by imaging particles transmitted through the object, measuring the pincushion or barrel distortions introduced by the projection system into the image of the known pattern, and exciting the multipoles in such a way that the pincushion or barrel distortions in the enlarged image caused by the projection system are at least partially corrected.

2. The method of claim 1, in which the pattern is generated by irradiating a diaphragm with a known pattern of transparent areas with a beam of particles.

3. The method of claim 1, in which the pattern is generated by scanning the particle beam in a known scan pattern.

4. The method of claim 1, in which the magnification from the object plane to the intermediate image plane is less than the magnification from the object plane to the image plane.

5. The method according to claim 1, the method further comprising:

determining the pincushion or barrel distortions for different settings of the apparatus, the different settings comprising different magnifications of the projection system or different energies of the particles illuminating the object position, forming a set of data for the different settings, after which the projection system is set for the magnification and energy used to image the object, and using said set of data, the multipoles are excited to correct at least partially the pincushion or barrel distortions.

6. The method according to claim 5 in which the set of data represents information concerning the excitation of the multipoles needed to correct pincushion or barrel distortions at different settings of the projection system.

7. The method according to claim 5 in which the set of data represents coefficients describing the pincushion or barrel distortions at different settings of the projection system.

8. The method of claim 5 in which the excitation of the multipoles is determined by interpolating or curve fitting the sets of data.

9. The method of claim 1 in which the pincushion or barrel distortions are described by a set of parameters, and a predetermined set of relative multipole excitations is used to null each of the parameters, each set of relative multipole excitations intended to null one of the parameters.

10. An apparatus for producing images of a sample having reduced distortions comprising:

a particle source for producing a beam of particles with the particle source;

an object plane on which an object to be imaged is placed, and when illuminated, having an intermediate image plane where a pattern is generated;

a condenser system for illuminating the object plane with the beam of particles;

a projection system for forming an enlarged image on an image plan of the object plane from particles transmitted through the object to be imaged, the projection system introducing pincushion or barrel distortions;

a detector for detecting the particles transmitted through the object to be imaged, the detector comprising multipoles that can be excited in order to alter the enlarged image of the object plane; and a computer-readable memory storing computer instructions, the instructions including a program for controlling the apparatus and causing the apparatus to carry out the steps of:

(i) producing a beam of particles;

(ii) illuminating the object plane with the beam of particles;

(iii) generating a known pattern in the intermediate image plane;

(iv) forming an enlarged image on the image plane of the object plane by imaging particles transmitted through the object, (v) measuring the pincushion or barrel distortions introduced by the projection system into the image of the known pattern, and (vi) exciting the multipoles in such a way that pincushion or barrel distortions caused by the projection system in the enlarged image are at least partially corrected.

11. The apparatus of claim 10 in which the computer instructions:

for generating a known pattern in the intermediate image plane include computer instruction for imaging a pattern having a known geometry; and the computer instruction for measuring the pincushion or barrel distortions include computer instructions for determining the distance from image points in the enlarged image from their expected positions based upon the known geometry of the pattern.

* * * * *